United States Patent [19]

Okada et al.

[11] Patent Number: 5,063,200
[45] Date of Patent: Nov. 5, 1991

[54] CERAMIC SUPERCONDUCTOR ARTICLE

[75] Inventors: Michiya Okada, Mito; Tadaoki Morimoto, Ibaraki; Akira Okayama, Hitachi; Yoshimi Yanai, Hitachi; Hiroshi Satoh, Hitachi; Toshimi Matsumoto, Katsuta; Yoshiteru Chiba, Hitachi; Kimihiko Akahori, Katsuta; Takahiko Kato, Hitachi; Toshiya Doi, Hitachi; Kazuhide Tanaka, Hitachi, all of Japan

[73] Assignee: Hitachi, Ltd., Tokyo, Japan

[21] Appl. No.: 230,053

[22] Filed: Aug. 9, 1988

[30] Foreign Application Priority Data

Aug. 12, 1987 [JP] Japan .................................. 62-199819
Dec. 11, 1987 [JP] Japan .................................. 62-311982

[51] Int. Cl.$^5$ ................................................ B32B 9/00
[52] U.S. Cl. ................................. 505/1; 505/701; 505/702; 505/703; 505/704; 421/688; 421/930
[58] Field of Search ........................ 505/1, 701–704; 428/688, 930

[56] References Cited

PUBLICATIONS

SC at 90K in the Y-Ba-Al-Cu-O System, Escudero et al., Japanese Journ. Appl. Phys., vol. 26, No. 6, June 1987, pp. L1019-L1020.
Dr. J. G. Bednorz and Dr. K. A. Muller, Z. Phys. B—Condensed Matter 64, 189–193 (1986), "Possible High Tc Superconductivity in the Ba-La-Cu-O System".
Kexue Tongbao, vol. 32, No. 10 (May, 1987), pp. 661–664, "Superconductivity Above Liquid Nitrogen Temperature . . . ".
Yomiuri Shimbun dated Feb. 24, 1987.
Nikkei Sangyo Shimbun dated Mar. 3, 1987.

*Primary Examiner*—Patrick J. Ryan
*Attorney, Agent, or Firm*—Antonelli, Terry, Stout & Kraus

[57] ABSTRACT

The present invention provides a shaped superconductor article such as wire, tape or disk, comprising an oxide superconductor phase and a metal phase in a monolayered or multilayered form, the metal phase comprising a copper, iron, nickel or titanium base alloy containing 1 to 10% by weight of aluminum and having an oxygen-impermeable oxide film formed thereon, preventing the diffusion of oxygen from the oxide superconductor phase to the metal phase.

24 Claims, 3 Drawing Sheets

CERAMIC SUPERCONDUCTOR ARTICLE

BACKGROUND OF THE INVENTION

1. Field of the Invention

The present invention relates to a shaped oxide superconductor article having a cross-section of composite phase comprising an oxide phase having a superconducting transition property and a metal phase, more particularly to a shaped oxide superconductor article, such as a wire, tape and disk, containing as the metal phase an industrially inexpensive metal having a composition suitable for constituting the oxide superconductor article.

2. Description of Related Art

As a high-temperature superconducting material having a much higher superconducting transition temperature than that of prior art superconducting materials, a lanthanum-barium-copper oxide was discovered by Dr. J. G. Bednorz and Dr. K. A. Müller at the beginning of 1986, and then an yttrium-barium-copper oxide (hereinafter referred to as Y-Ba-Cu-O system) which has a transition temperature of about 90 K was discovered by Dr. Chu of Houston University in U.S.A., in the spring of 1987. Such discovery was made also in China and Japan at that time. These discoveries in succession are called the revolution of superconductors. Nowadays, fundamental studies are being made on the composition, crystal structure, properties and theory of superconducting materials, practical studies on methods of synthesizing the materials, on electronic or power electrical applications of the materials and further on research or development of new materials exhibiting superconducting transition at a higher temperature or room temperature.

In these studies, research and development, a technique of shaping the high-temperature superconducting materials holds a position as an elementary technique in power electrical applications such as a superconducting magnet. In prior art superconducting alloys or compounds, it is known that the cross-section of shaped articles is constituted by a composite phase of a superconducting phase and a metal phase. The metal phase functions as a supporter for a superconducting material while the material is being plastically worked in a long article and heat treated, as a strength-holding means during or after coiling of a superconducting wire, or as a stabilizer against the superconducting-to-normal transition in applying electric current t the article.

As a material for the metal phase of oxide superconductor articles are only known copper, copper-nickel alloys and silver, as reported by news papers, *Nihon Keizai Shimbun* dated Mar. 4, 1987 and Apr. 3, 1987, and *Nikkei Sangyo Shimbun* dated May 19, 1987. However, no details are known about these metals.

The Y-Ba-Cu-O system known as a high-temperature superconducting material is analyzed to be an oxygen-deficient type trilayered perovskite crystal. In order to shape this material in an article, for example, a long wire, it is necessary that the material is firstly powdered, charged into a metal pipe, drawn and finally reheated or resintered to revive the superconduction in the article. In the case of the metal phase being copper or copper-nickel alloy, removal of the metal phase by, for example, dissolving it with an acid is needed before reheating, as reported in, for example, Spring Meeting (100 th, Tokyo) of Japan Metal Society. This is because the copper of the metal phase is oxidized during reheating, so that the oxygen of superconducting materials is taken by the copper and the material exhibits no superconducting transition.

In the case, on the other hand, of the metal phase being constituted by silver, there hardly occurs the above-mentioned problem, because the oxygen-dissociating pressure of silver is high at the reheating temperatures. However, since the reheating temperature is nearly as high as the melting point of silver, the silver is remarkably grown in coarser crystal grains and greatly softened, so that strength required by wires is lost. Further, there is an economical problem that silver is expensive.

Thus, in the case of using copper or copper-nickel alloys as the metal phase in shaping oxide superconductor articles, the metal phase is in fact finally lost so that any practical shaped superconductor articles cannot be made. Further, silver is also hardly technically and economically acceptable as the metal phase as mentioned above.

SUMMARY OF THE INVENTION

One object of the present invention is to provide a shaped oxide superconductor article with the above-mentioned problems eliminated.

Another object of the present invention is to provide an alloy composition suitable for the metal phase constituting the shaped oxide superconductor article.

These objects are achieved by constituting the shaped oxide superconductor articles from an oxide superconductor phase and a metal phase in a monolayer or multilayer surrounding the superconductor articles, at least one layer of the metal phase having an electrically conductive dense oxide film which prevents the diffusion of oxygen from the oxide superconductor phase to the metal phase.

In accordance with the present invention, as the metal phase is used an aluminum-containing, copper, iron, nickel, or titanium base alloy having a melting point of not lower than the reheating temperature of the oxide superconductor, preferably a copper base alloy containing 1 to 10% by weight of aluminum.

DETAILED DESCRIPTION OF THE INVENTION

Figure 1:
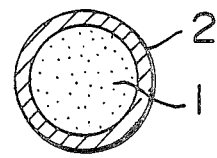
FIG. 1 is a diagrammatical cross-sectional view of the oxide superconductor wire obtained in EXAMPLE 1 when cut transversely to the axis thereof.

The present invention concerns a shaped oxide superconductor article comprising an oxide superconductor phase and a metal phase. However, a wire alone is detailedly referred to herein, but it should be noted that the present invention is not limited to the wire alone and other shaped articles such as tapes, disks (Bitter Type Coil) or the like fall within the scope of the present invention.

The present inventors have found that the use of an aluminum-containing, copper, iron, nickel or titanium base alloy having a melting point of not lower than a temperature of reheating for revival of superconductivity, as a material for the metal phase of oxide superconductor article makes it unnecessary to remove part of the metal phase before carrying out the reheating process. This function is inferred that the incorporation of aluminum in the metal phase of a copper, iron, nickel or titanium base alloy, which may contain a well-known third ingredient or ingredients other than the aluminum, forms a very thin oxide film on the surface of the metal phase, which thin film grows at so low a growing rate that the film does not substantially take oxygen from the oxide superconductor phase enveloped with the metal phase. In other words, the metal phase is improved in resistance to oxidation by incorporating aluminum into a base metal. This oxide film is electrically conductive.

Further, in accordance with the present invention, the metal phase may not only be monolayered, but also multilayered to raise up the strength of the shaped oxide superconductor article.

However, in the case where that the aluminum-containing alloy is used singly or in a monolayered form as a metal sheath, a reaction layer may be formed at the interface between the oxide superconductor phase and the metal sheath during the reheating step, and this reaction layer deteriorates the superconducting property. Further, in the case that silver or a silver alloy having a higher melting point than that of pure silver is used in a monolayered form as a metal sheath, the strength of the metal sheath is not only conspicuously lowered when reheated but also oxygen released during the reheating step from the oxide superconductor phase may not be restored from the exterior during the cooling step, resulting in the deterioration of the superconducting property.

Therefore, the metal phase may be in a mono-layered form but it is preferably in a multilayered form.

In the case where that the metal phase is multi-layered, the adjacent layers are constituted by metals different from each other. When a metal layer in contact with the oxide superconductor phase is the first layer, a layer outside the first layer is the second layer and the next layer is the third layer and in this order the uppermost layer is the n-th layer, the object of the present invention may be achieved by using silver or an silver alloy having a higher melting point higher than that of pure silver as the first layer and an aluminum-containing, copper, iron, nickel or titanium base alloy as the second layer or the n-th layer.

Still further, oxygen supply in reheating may be accelerated by incorporating a powder of $Ag_2O$ or $Ag_2O_2$ into a powder of oxide superconductor.

Alternatively, oxygen supply may be made by providing a number of minute through-holes in the metal phase to bring the oxide superconductor phase in contact with air in reheating.

In the case of the multilayered metal phase, the first or lowermost layer, i.e., the layer in contact with the oxide superconductor phase may be constituted by Ag or an Ag alloy having a higher melting point than that of pure silver, thereby preventing the diffusion of elements other than silver and oxygen from the metal phase into the oxide superconductor phase during the reheating step. Therefore, the production of reaction products having an adverse effect on the superconducting transition property of the oxide can be inhibited. Gold or a gold alloy may be used in place of the silver or silver alloy.

Aluminum incorporated into the second or n-th layer of the multilayered metal phase as a metal sheath consisting of a copper, iron, nickel or titanium alloy, which may contain a well-known third element or elements other than aluminum, forms a very thin dense oxide film on the metal sheath when reheated for revival of the oxide superconductor. This thin film grows at a low rate during reheating, so that the consumption of the alloy with oxygen is not only inhibited but also a great amount of oxygen is not taken from the oxide superconductor phase.

The aluminum content is preferably in the range of 1 to 10% by weight of the alloy. If the content is less than 1% by weight, resistance to oxidation is not substantially improved. If the content exceeds 10% by weight, on the other hand, working such as drawing becomes hard. Further, since there occurs no substantial penetration of oxygen through the thin oxide film of the metal phase, it follows that the metal phase holds the oxygen dissociated from the oxide superconductor phase within the oxide superconductor phase.

The multilayered metal phase may be constituted by the first layer of silver or the silver alloy in contact with the oxide superconductor phase, the uppermost layer of the aluminum-containing alloy and a middle layer or layers of an oxidation resistant metal, for example, a noble metal. Alternatively, the middle layers may be constituted by laminating some repeated units, each of which is comprised of an oxide superconductor layer and a layer of the silver or silver alloy. In this multi-layered metal phase, the first layer and the middle layer or layers both are not oxidized and the uppermost layer has a very thin oxide film preventing the escaping of oxygen from the superconductor phase.

In the present invention, the kind of the superconducting material used is not specified, but a Y-Ba-Cu oxide superconductor having a transition temperature of 90 K or higher, or a superconductor having a lanthanide substituted for at least part of yttrium is particularly effective.

The shaped oxide superconductor article of the present invention may be formed by filling a monolayered or multilayered metal tube as the metal phase with an oxide superconductor powder and optionally a powder of $Ag_2O$ or $Ag_2O_2$, drawing or rolling the metal tube with the powder in a shape of wire, tape or disk, and then reheating to sinter the oxide.

According to the present invention, the shaped oxide superconductor article can be obtained with holding the properties of industrially practical metals or alloys and without losing the superconducting transition property of oxide superconducting materials. Therefore, the present invention is industrially or practically highly advantageous in using the superconducting material in a shaped article.

The present invention will be illustrated below with reference to some examples.

EXAMPLE 1

Figure 2:
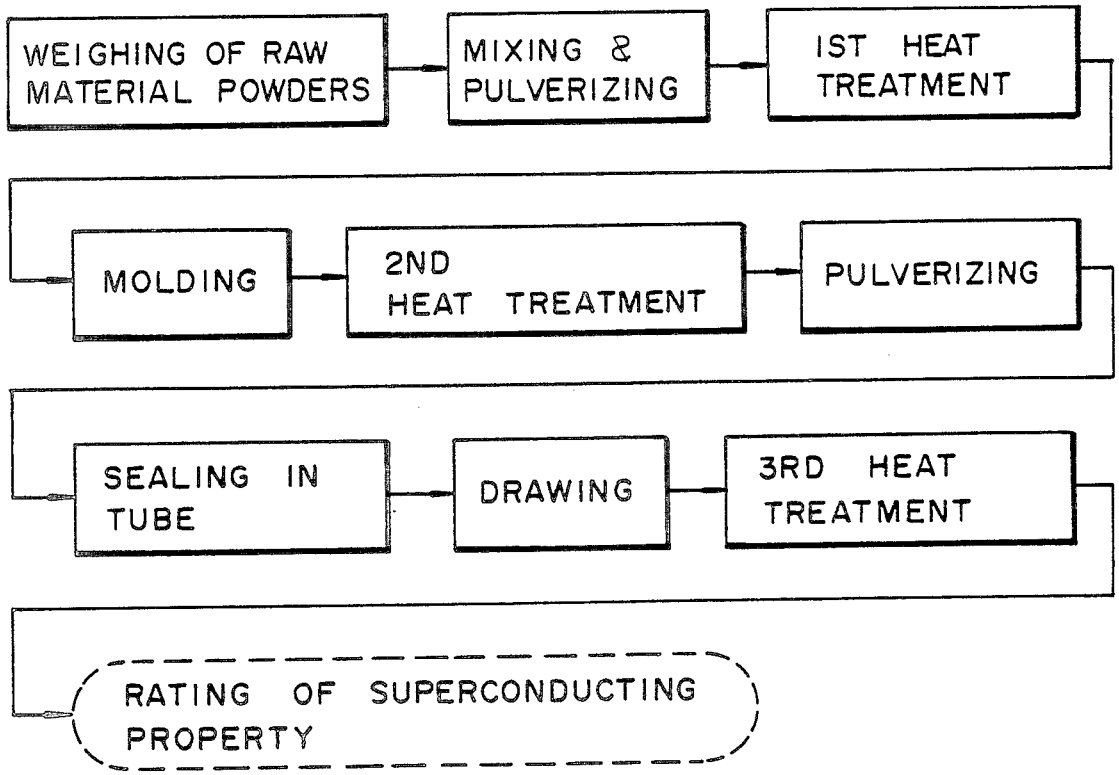
FIG. 2 is a flow chart showing the process for making the superconductor wire, used in EXAMPLE 1.

FIG. 1 is a diagrammatical cross-sectional view of a superconductor wire cut transversely to the axis of the wire. Reference number 1 is a Y-Ba-Cu-O system superconductor as oxide superconductor phase, and 2 is a copper alloy sheath as a metal phase containing 9.33% by weight of aluminum. The wire shown in FIG. 1 was prepared in accordance with a series of steps pictured in the flow chart shown in FIG. 2. Firstly, starting materials, $Y_2O_3$, $BaCO_3$ and $CuO$, were weighed in such amounts that the atomic molar proportions of Y : Ba : Cu are 1 : 2 : 3, respectively. Then, these starting materials were mixed together and to this mixture was added pure water. This mixture was milled by a centrifugal ball mill for 1 hour. The milled mixture was dehydrated at 150° C. and then subjected to the first heat treatment under the conditions shown in Table 1. The thus obtained calcined mixture in a powdery form was press molded in a plurality of pellets of 30 mm in diameter and 3 mm in thickness in a metal mold and then subjected to the second heat treatment under the conditions shown in Table 1.

TABLE 1

| | Heating Rate (°C./hr) | Holding (°C. × hr) | Cooling Rate (°C./hr) | Atm. |
|---|---|---|---|---|
| 1st Heat Treat. | 300 | 950 × 5 | 200 | $O_2$ stream |
| 2nd Heat Treat. | " | " | " | " |
| 3rd Heat Treat. | " | 950 × 10 | 100 | " |

The thus obtained pellets were confirmed to be magnetically levitated by the Meissner effect, i.e., have a superconductivity. These pellets were pulverized by an attrition mill for 10 minutes. Then the resultant powder was charged and sealed into a special aluminum bronze (trade name: Arms bronze) -made tube having an outer diameter of 10 mm, inner diameter of 7 mm and a length of 250 mm, so that the powder has a theoretical density ratio of 0.5. The chemical analysis of the special aluminum bronze is shown in Table 2.

TABLE 2

| Ingredient | Al | Fe | Mn | Ni | Cu | others |
|---|---|---|---|---|---|---|
| % by weight | 9.33 | 3.92 | 1.12 | 1.89 | 83.51 | 0.23 |

A drawing step was carried out by means of a drawbench. The drawing step was repeated until the outer diameter of the tube was reduced down to 2 mm. An annealing step was carried out in an atmosphere at a temperature of 600° to 700° C. for a period of 30 minutes to 1 hour at an increment of 25% in a cross-section reduction. The finally subjected to the third heat treatment under the conditions shown in Table 1.

The thus obtained wires were observed in the examination of appearance to have no cracks or flaws. Further, the special aluminum bronze as a sheath was kept to have such a golden color as shown before the heat treatments.

Figure 3:
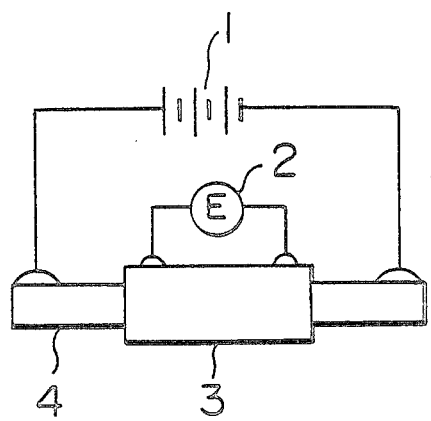
FIG. 3 is a circuit diagram for determining the superconducting transition property and critical current density of the superconductor wire obtained in EXAMPLE 1.

The wires were further cut in a length of about 30 mm to prepare samples for the examination of superconductivity. FIG. 3 shows a circuit for determination of electric resistance by the four-terminal method. The determination of a superconducting transition temperature, Tc, was made by gradually moving a sample position from a high-temperature region to a low-temperature region in the vapor phase portion of a cryostat in which the sample and liquid nitrogen were sealed. Tc was defined to be a temperature at which the indication of a digital volt meter was reduced below a detectible sensitivity (1 $\mu V$) at a determining current 1 mA. The digital volt meter was connected between the central two terminals. The Tc was determined to be 83 K.

Figure 4:
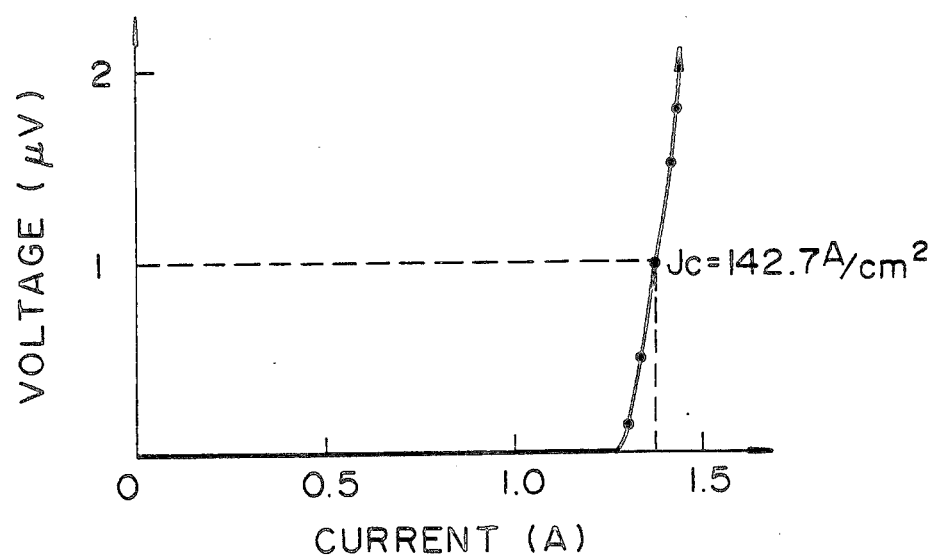
FIG. 4 is a current-voltage curve for rating the critical current density determined in EXAMPLE 1.

FIG. 4 shows the current-voltage curve of the superconductor wire obtained in this example determined at the temperature of liquid nitrogen. The outer diameter of the samples was 2 mm and the core diameter (the outer diameter of the superconductor phase) was 1.11 mm. The critical current density, Jc, which is defined by a current at which a potential of 1 $\mu V$ is produced at a distance of 10.8 mm between the central two terminals, was determined to be about 143 A/cm$^2$.

In this example, it was found that the oxide superconductor wire of the present invention could be prepared without removing any part of the metal sheath and had a high superconducting transition property and high critical current density.

EXAMPLE 2

Figure 5A:
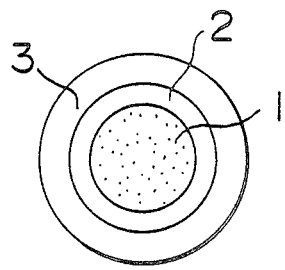
FIG. 5($a$) and 5($b$) are diagrammatical cross-sectional views of the oxide superconductor wire and tape, respectively, obtained in EXAMPLE 2 when cut transversely to the axis thereof.
Figure 5B:
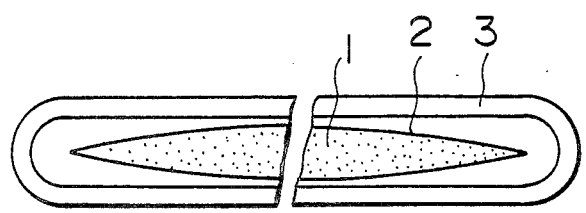
Figure 6:
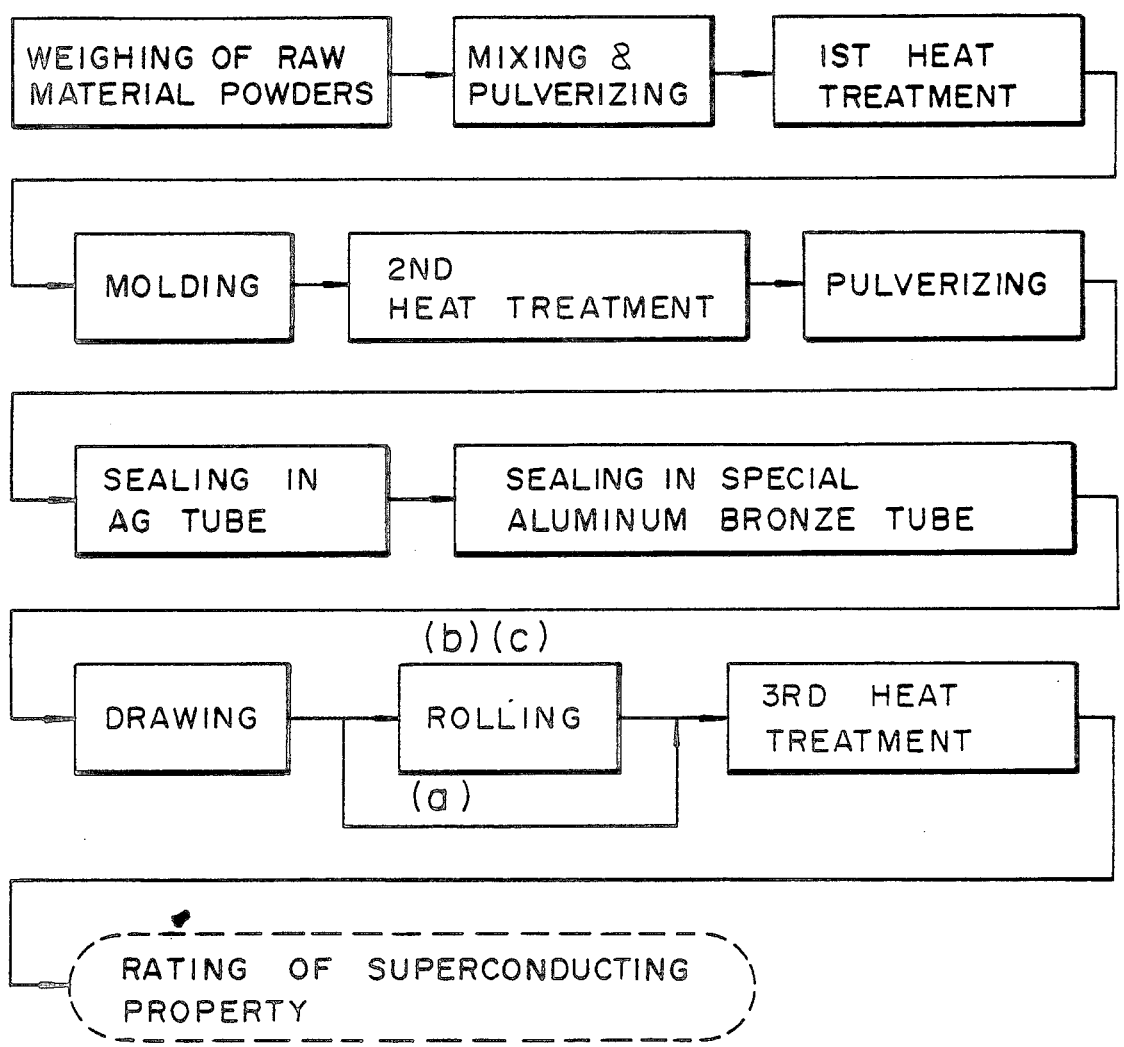
FIG. 6 is a flow chart showing the process for making the superconductor wire, used in EXAMPLE 2.

FIGS. 5(a) and 5(b) are cross-sectional views of the oxide superconductor wire and tape, respectively, cut transversely to the axes thereof. Reference number 1 is a Y-Ba-Cu-O system superconductor as an oxide superconductor phase, 2 is silver of 99.9% by weight in purity as a metal phase, and 3 is a copper base alloy as a metal phase, the alloy containing 9.33% by weight of aluminum. The wire and tape shown in FIG. 5(a) and 5(b) were prepared in accordance with a series of steps pictured by the flow chart shown in FIG. 6. Firstly, starting materials, $Y_2O_3$, $BaCO_3$ and $CuO$, were weighed in such amounts that the atomic molar proportions of Y : Ba : Cu are 1 : 2 : 3, respectively. Then, these starting materials were mixed together and to this mixture was added pure water. This mixture was milled by a centrifugal ball mill for 1 hour. The milled mixture was dehydrated at 150° C. and then subjected to the first heat treatment under the conditions shown in Table 3. The thus obtained calcined mixture in a powdery form was press molded in a plurality of pellets of 30 mm in diameter and 3 mm in thickness in a metal mold and then subjected to the second heat treatment under the conditions shown in Table 3.

TABLE 3

| | Heating Rate (°C./hr) | Holding (°C. × hr) | Cooling Rate (°C./hr) | Atm. |
|---|---|---|---|---|
| 1st Heat Treat. | 300 | 950 × 5 | 200 | $O_2$ stream |
| 2nd Heat Treat. | " | 950 × 5 | " | " |
| 3rd Heat Treat. | " | 910 × 10 | 100 | " |

The thus obtained pellets were confirmed to be magnetically levitated by the Meissner effect, i.e., have a superconductivity. These pellets were pulverized by an attrition mill for 10 minutes. Then the resultant powder was charged and sealed into in two pure silver-made tubes, both of which have an outer diameter of 6 mm, thickness of 0.5 mm and length of 250 mm, at a density of 2.7 g/cm$^3$. These tubes each was charged and sealed into a special aluminum bronze-made tube having an outer diameter of 10 mm, thickness of 1.5 mm and length of 300 mm. The chemical analysis (% by weight) of the special aluminum bronze used is as shown in Table 2 above. Thus, the two tubes (a) and (b) were obtained.

Another tube (c) was prepared by mixing a powder of a superconducting material, $YBa_2Cu_3O_7$, which had been heat treated and pulverized, and a powder of reagent grade $Ag_2O_2$ in such a molar ratio of 1 : 1 (weight ratio of 1 : 0.37), charging and sealing the mixture into a silver-made tube and then the silver-made tube into a special aluminum bronze-made tube in the same manner a in the case of the tubes (a) and (b). The tube (a) was drawn by means of a drawbench in a wire as shown in FIG. 5(a). The other tubes (b) and (c) were drawn by means of a drawbench until the outer diameter of the wire was reduced down to 2.8 mm and then rolled in a tape of 0.2 mm thick, as shown in FIG. 5(b). An annealing step was carried out in an atmosphere at a temperature of 600° to 700° C. for a period of 30 minutes to 1 hour at an increment of 25% in a cross-section reduction. The drawn wire and drawn and rolled tapes were cut in a length of about 100 mm and then subjected to the third heat treatment as shown in Table 3.

The observation of appearance revealed that the thus obtained wire and tapes all had no cracks or flaws and that the special aluminum bronze use as a sheath was kept to have such a golden color as shown before the heat treatment, i.e., the sheath appeared to be almost not oxidized. Further, the observation of the wire and tapes by an optical microscope and an SEM with EDX revealed that a good metal bond was obtained at an interface between the special aluminum bronze and the silver sheath and further that there were produced no reaction products from diffusion of the ingredients of the special aluminum bronze at an interface between the silver sheath and the oxide superconductor phase.

The thus obtained wire was cut in a length of 30 mm for determination of superconductivity. The critical current density, Jc, was determined by a direct current four-terminal method in liquid nitrogen. The Jc is defined by a current per unit cross-section of the oxide superconductor core when a voltage of 1 $\mu$V was applied between the terminals. Table 4 shows the values of Jc for the samples (a), (b) and (c) drawn from the tubes (a), (b) and (c) above, respectively.

TABLE 4

| Sample No. | Critical Current Density (A/cm$^2$) | Notes |
|---|---|---|
| (a) | 350 | This invention, Wire |
| (b) | 785 | This invention, Tape |
| (c) | 820 | This invention, Tape |

From Table 4 it is clear that the present invention has such an advantage that a high current density of 350 A/cm$^2$ or more can be obtained without removing an metal sheath from the article.

What is claimed is:

1. A shaped superconductor article, which comprises:
    a shaped high Tc ceramic oxide superconductor shaped in a form of one of a wire, a tape and a disk;
    a metal sheath surrounding said shaped oxide superconductor and comprising a lowermost layer adjacent said shaped oxide superconductor and at least one upper layer adjacent said lowermost layer; and
    an oxygen impermeable conductive oxide film made of aluminum oxide formed at an interface between said lowermost layer and said at least one upper layer so as to prevent diffusion of oxygen from said shaped oxide superconductor to said at least one upper layer.

2. The article according to claim 1, wherein at least one of said at least one upper layer of the metal sheath comprises an aluminum-containing, copper, iron, nickel or titanium base alloy.

3. The article according to claim 2, whereby said alloy contains 1 to 10% by weight of aluminum.

4. The article according to claim 1, wherein said metal sheath is made of an alloy which contains 1 to 10% by weight of aluminum.

5. The article according to claim 1, wherein an uppermost layer of the metal sheath comprises an aluminum-containing, copper, iron, nickel or titanium base alloy.

6. The article according to claim 5, wherein said alloy contains 1 to 10% by weight of aluminum.

7. The article according to claim 1, wherein the lowermost layer of the metal sheath comprises silver or a silver base alloy having a higher melting point than that of pure silver.

8. The article according to claim 1, wherein the lowermost layer of the metal sheath comprises gold or a gold alloy.

9. The article according to claim 1, wherein said metal sheath has a number of minute through-holes provided therein.

10. The article according to claim 1, wherein the oxide superconductor is a Y-Ba-Cu system oxide.

11. A shaped superconductor article, which comprises:
    a shaped high Tc ceramic oxide superconductor shaped in a form of one of a wire, a tape and a disk;
    a metal sheath surrounding said shaped oxide superconductor; and
    an oxygen impermeable conductive oxide film made of aluminum oxide formed at an interface between said shaped oxide superconductor and said metal sheath so as to prevent diffusion of oxygen from said shaped oxide superconductor to said metal sheath.

12. The article according to claim 11, wherein said metal sheath is made of an aluminum-containing copper, iron, nickel or 13. The article according to claim 12, wherein said alloy contains 1 to 10% by weight of aluminum.

14. The article according to claim 11, wherein said metal sheath has a number of minute through-holes provided therein.

15. The article according to claim 11, wherein the oxide superconductor is a Y-Ba-Cu system oxide.

16. A shaped superconductor article which comprises:
    a shaped high Tc ceramic oxide superconductor shaped in a form of one of a wire, a tape and a disk;
    a metal sheath surrounding said shaped oxide superconductor and comprising at least one lower layer adjacent said shaped oxide superconductor and an uppermost layer adjacent said at least one lower layer; and
    an oxygen impermeable conductive oxide film made of aluminum oxide formed at an interface between said at least one lower layer and said uppermost layer so as to prevent diffusion of oxygen from said shaped oxide superconductor to said uppermost layer.

17. The article according to claim 16, wherein said uppermost layer comprises an aluminum-containing copper, iron, nickel or titanium base alloy.

18. The article according to claim 17, wherein said alloy contains 1 to 10% by weight of aluminum.

19. The article according to claim 16, wherein said metal sheath has a number of minute through-holes provided therein.

20. The article according to claim 16, wherein the oxide superconductor is a Y-Ba-Cu system oxide.

21. A shaped superconductor article according to claim 16, wherein said at least one lower layer is made of a material selected from the group consisting of silver, a silver base alloy having a higher melting point than that pure silver, gold and a gold alloy.

22. The article according to claim 16, wherein the uppermost layer of the metal sheath comprises an aluminum-containing alloy, and a layer of a metal or a plurality of layers of different metals are provided between said uppermost layer and the oxide superconductor phase.

23. The article according to claim 22, wherein said layer of metal or said plurality of layers of different metals are made of noble metals.

24. The article according to claim 16, wherein the uppermost layer of the metal sheath comprises an aluminum-containing alloy, a lowermost layer comprises silver or a silver alloy and a middle layer or layers are constituted by laminating a plurality of repeated units, each of which is comprised of an oxide superconductor layer and a layer of the silver or silver alloy.

* * * * *